United States Patent [19]
Zhu et al.

[11] Patent Number: 5,243,206
[45] Date of Patent: * Sep. 7, 1993

[54] LOGIC CIRCUIT USING VERTICALLY STACKED HETEROJUNCTION FIELD EFFECT TRANSISTORS

[75] Inventors: X. Theodore Zhu, Chandler; Jonathan K. Abrokwah; Herbert Goronkin, both of Tempe; William J. Ooms, Chandler; Carl L. Shurboff, Gilbert, all of Ariz.

[73] Assignee: Motorola, Inc., Schaumburg, Ill.

[*] Notice: The portion of the term of this patent subsequent to Aug. 25, 2009 has been disclaimed.

[21] Appl. No.: 724,636

[22] Filed: Jul. 2, 1991

[51] Int. Cl.$^5$ .................. H01L 31/072; H01L 31/109; H01L 29/94; H01L 27/11
[52] U.S. Cl. .................... 257/192; 257/194; 257/369; 257/903
[58] Field of Search .............. 357/22 A, 16, 4, 42, 357/22 MD; 257/192, 194, 369, 903

[56] References Cited

U.S. PATENT DOCUMENTS

| | | | |
|---|---|---|---|
| 4,743,951 | 5/1988 | Chang et al. | 357/16 |
| 4,768,076 | 8/1988 | Aoki et al. | 257/369 |
| 4,882,608 | 11/1989 | Smith | 357/16 |
| 4,920,397 | 4/1990 | Ishijima | 357/42 |
| 5,010,386 | 4/1991 | Grover | 357/42 |
| 5,060,031 | 10/1991 | Abrokwah et al. | 357/22 A |
| 5,079,601 | 1/1992 | Esaki et al. | 357/4 |
| 5,113,231 | 5/1992 | Soderstrom et al. | 357/16 |
| 5,142,349 | 8/1992 | Zhu et al. | 257/192 |

OTHER PUBLICATIONS

P. Sercel et al, "Type II Broken-gap quantum wires and quantum Dot arrays-A novel concept for self doping semiconductor Nanostructures," Appl. Phys. left, 57(15) Oct. 1990.

Zhu et al "Excitonic Insulator Transition in Gasb-Alsb-InAs quantum-23ll structures" 75(7) Solid State Communications, 1990.

Primary Examiner—Rolf Hille
Assistant Examiner—Wael Fahmy
Attorney, Agent, or Firm—Joe E. Barbee

[57] ABSTRACT

Logic circuits using a heterojunction field effect transistor structure having vertically stacked complementary devices is provided. A P-channel quantum well and an N-channel quantum well are formed near each other under a single gate electrode and separated from each other by a thin layer of barrier material. P-source and P-drain regions couple to the P-channel. N-source and N-drain regions couple to the N-channel. The P-source/drain regions are electrically isolated from the N-source/drain regions so the P-channel and N-channel devices may be interconnected to provide many logic functions.

15 Claims, 3 Drawing Sheets

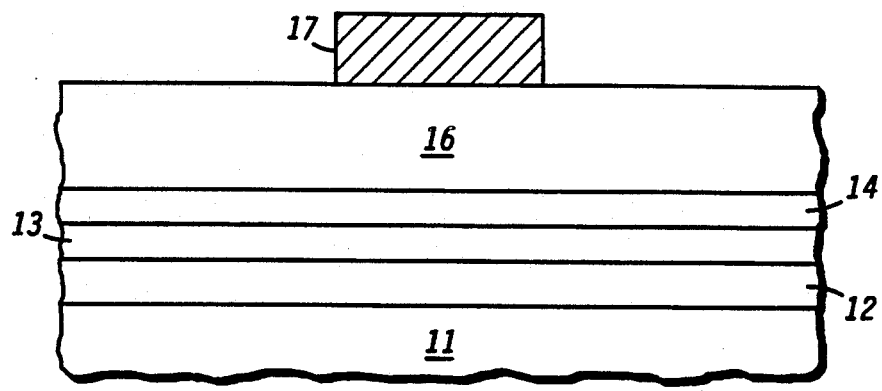
FIG. 1
FIG. 2A
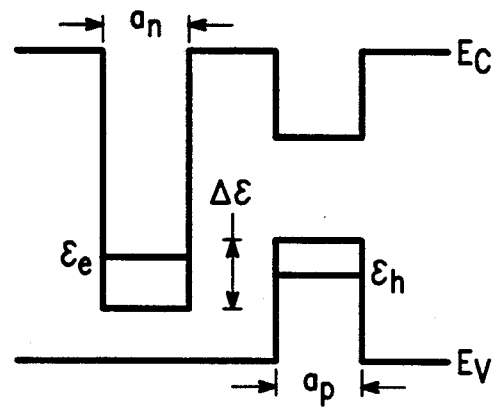
FIG. 2B
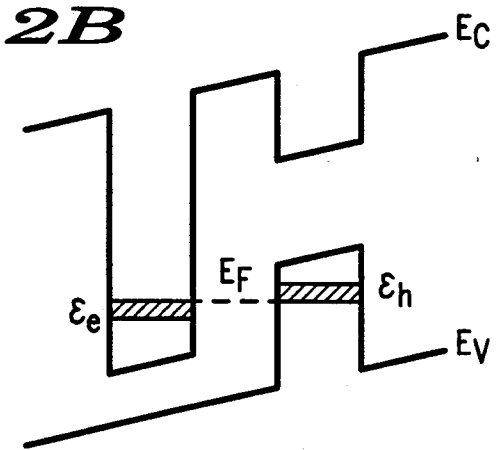

LOGIC CIRCUIT USING VERTICALLY STACKED HETEROJUNCTION FIELD EFFECT TRANSISTORS

BACKGROUND OF THE INVENTION

This invention relates, in general, to logic circuits using field effect transistors, and more particularly, to logic circuits using vertically stacked complementary field effect transistors.

Complementary field effect logic, such as silicon CMOS, is very power efficient as a result of data being stored as potential energy rather than current flow. Compound semiconductors, such as heterojunction field effect transistors (HFETs), promise even more efficient devices as a result of higher mobility of charge carriers in compound semiconductor materials. One problem with conventional HFET structures, however, is a mismatch in P-channel and N-channel threshold voltage and operating characteristics. Mismatch between N-channel and P-channel devices complicated processing and made circuits using the devices more complex.

Compound semiconductors are expensive to process. Unless a device can be manufactured in a smaller chip using compound semiconductors, it cannot be cost competitive with silicon designs. This cost problem has limited compound semiconductor applications to high performance integrated circuits where performance commands a premium price, justifying the additional cost. To successfully compete in commodity markets such as computer memory, a design is needed which dramatically reduces chip size of compound semiconductor circuits while maintaining performance advantages as compared to silicon devices.

SUMMARY OF THE INVENTION

The advantages of the present invention are achieved by a heterojunction field effect transistor structure having vertically stacked complementary devices. A P-channel quantum well and an N-channel quantum well are formed near each other under a single gate electrode and separated from each other by a thin layer of barrier material. P-source and P-drain regions couple to the P-channel. N-source and N-drain regions couple to the N-channel. The P-source/drain regions are electrically isolated from the N-source/drain regions so that the P-channel and N-channel devices may be interconnected to provide many logic functions.

BRIEF DESCRIPTION OF THE DRAWINGS

FIG. 1 illustrates a highly simplified cross section through a portion of a dual channel HFET in accordance with the present invention;

FIG. 2A illustrates a band diagram of the structure shown in FIG. 1 with no applied bias;

FIG. 2B illustrates a band diagram of the structure shown in FIG. 1 with an applied gate bias;

DETAILED DESCRIPTION OF THE DRAWINGS

Figure 3:
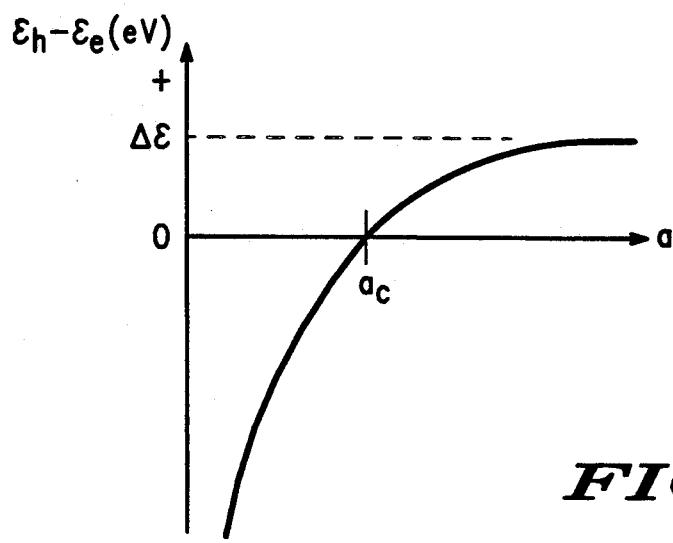
FIG. 3 illustrates, in graphical form, a relationship between quantized energy of a first hole state in a P-channel quantum well and a quantized energy of an electron state in an N-channel well as a function of quantum well thickness.

FIGS. 1-3 illustrate a vertically stacked complementary HFET structure using mutually self-doping N-channel and P-channel devices. Although self-doping is believed to be the most efficient method of carrying out the present invention, it should be understood that conventional doping techniques may be used, as illustrated in the embodiment shown in FIG. 6. Conventional doping techniques allow greater latitude in material choice yet sacrifice some performance advantages of the self-doped structures.

A primary concern in design of quantum well field effect transistors is the structure of the channel regions underneath the gate electrode as the channel region performance largely determines overall performance of the transistor. FIG. 1 illustrates a high simplified cross section through channel regions above a complementary heterojunction field effect transistor in accordance with the present invention. All material layers shown in FIG. 1, and subsequent embodiments of the present invention are substantially single crystal epitaxially grown layers. This requires that each epitaxial layer comprise a material which is crystalographically compatible with an underlying substrate. Therefore, in addition to electronic material constraints discussed hereinafter in regard to the particular embodiments, it should be noted that material choice is also limited by crystal properties. The epitaxial layers of the present invention may be grown by metal organic chemical vapor deposition (MOCVD), molecular beam epitaxy (MBE), or atomic layer epitaxy (ALE), or the like.

Although the present invention is described in terms of a complementary structure having a single N-channel and a single P-channel device, it should be understood that a variety of complementary and non-complementary structures can be provided with slight modifications. These modifications are easily understood by those of skill in the art, and are intended to be encompassed within the scope of the present invention. For example, a structure can be made with a plurality of vertically stacked N-channel devices, each device having independent source/drain electrodes. Also, a plurality of vertically stacked P-channel devices may be provided simply by providing multiple P-channels. Further, both enhancement and depletion devices may be manufactured in the vertically stacked structure.

The embodiment shown in FIG. 1 comprises a wide band gap buffer layer 11 comprising a material such as aluminum antimonide (AlSb). Buffer layer 11 is conveniently formed on a crystal substrate (not shown). Gallium arsenide may also be used for buffer layer 11. Other wide band gap materials are known and used in compound semiconductor devices, but, as will be seen, AlSb is desirable in the preferred embodiments to ensure compatibility with other materials used in overlying layers of the preferred embodiments. A P-channel quantum well 12 is formed covering AlSb buffer layer 11. In a preferred embodiment, P-channel quantum well 12 comprises gallium antimonide (GaSb). P-channel quantum well is covered by a barrier layer 13 having a predetermined thickness and comprising a material with a wide band gap such as AlSb.

N-channel quantum well 14 comprises a material such as indium arsenide (InAs) in the preferred embodiments and is formed over barrier 13. A second barrier layer 16 is formed over N-channel quantum well 14. Second barrier 16 also comprises a wide band gap material such as AlSb. Gate electrode 17 is formed over a portion of second barrier 16 and makes a Schottky contact with second barrier layer 16. It should be noted that P-channel quantum well 12 and N-channel quantum well 14 are substantially undoped and that no charge supply layer need be placed in the barrier layers.

The particular materials for P-channel quantum well 12 and N-channel quantum well 14 are chosen so that P-channel quantum well 12 has a valence band energy greater than conduction band energy of N-channel quantum well 14 as illustrated in FIG. 2A and FIG. 2B to provide self doping. Self doping can be provided even if valence band energy of the P-channel is less than conduction band energy of the N-channel, but the preferred embodiment is believed to result in greater ease of application. Much greater latitude in material choice is available if conventional doping techniques are used. Conduction band energy ($E_c$) and valence band energy ($E_v$) are illustrated in FIG. 2A and FIG. 2B through the cross section structure shown in FIG. 1.

P-channel quantum well 12 and N-channel quantum well 14 are formed in a wide band gap host material comprising barriers 11, 13, and 16. A quantized energy level for a first hole state ($\epsilon_h$) is indicated by a line within P-channel quantum well 12. $\epsilon_h$ lies at an energy somewhat lower than valence band energy for P-channel quantum well 12. The precise energy for $\epsilon_h$ is determined by thickness of P-channel quantum well 12, indicated by $a_p$. $\epsilon_h$ is the minimum energy for holes in P-channel quantum well 12.

Likewise, $\epsilon_e$ indicates a quantized energy level for a first electron state in N-channel quantum well 14. $\epsilon_e$ lies somewhat above conduction band energy for N-channel quantum well 14 and is also determined by thickness $a_n$ of N-channel quantum well 14. $\Delta\epsilon$ is an energy difference between valence band energy in P-channel quantum well 12 and conduction band energy in N-channel quantum well 14. When GaSb and InAs are used for the quantum wells, $\Delta\epsilon$ is about 0.175 eV. $\epsilon_e$ is the minimum energy for electrons in N-channel quantum well 14.

The predetermined thickness of barrier 13 is designed to allow overlap between the electron wave function in N-channel quantum well 14 and the hole wave function in P-channel quantum well 12. In other words, barrier 13 is thin enough that charge carriers can couple between the two quantum wells. When $\epsilon_h$ is at a greater energy than $\epsilon_e$, valence band electrons in P-channel quantum well 12 will prefer to move to the conduction band in N-channel quantum well 14. This creates a number of free electrons in N-channel quantum well 14 and an equal number of free holes in P-channel quantum well 12. Thus, when $\epsilon_h$ is greater than $\epsilon_e$ each quantum well dopes the other quantum well with charge carriers so that the quantum well becomes conductive. As illustrated in FIG. 2A, absent any bias applied by gate 17 (shown in FIG. 1) both P-channel quantum well 12 and N-channel quantum well 14 are undoped and non-conductive. As shown in FIG. 2B, however, with applied bias both P-channel quantum well 12 and N-channel quantum well 14 become doped and conductive.

It is important to note that although N-channel quantum well 14 and P-channel quantum well 12 are mutually self doping, the two channels remain electrically isolated. Barrier 13 maintains electrical isolation so that the P-channel device operates virtually independently of the N-channel device for a given gate bias voltage.

As noted hereinbefore, $\epsilon_e$ and $\epsilon_h$ vary with thickness of the quantum wells. As quantum well 12 becomes thinner, $\epsilon_h$ becomes more separated from $E_v$. Likewise, as quantum well 14 becomes thinner, $\epsilon_e$ becomes more separated from $E_c$. This aspect of the self doping structure shown in FIG. 1 can be used to create HFET structures having both depletion mode and enhancement mode characteristics.

FIG. 3 graphically illustrates the relative energy difference between $\epsilon_e$ and $\epsilon_h$ as quantum well thickness is changed. The graph in FIG. 3 illustrates quantum well thickness on the horizontal axis, assuming that both quantum wells are the same thickness (a) for ease of illustration. The vertical axis in FIG. 3 represents energy difference between the first hole state in P-channel quantum well 12 and the first electron state in N-channel quantum well 14. It can be seen in FIG. 3 that at some critical thickness $a_c$, $\epsilon_h$ and $\epsilon_e$ are at the same energy. This critical thickness is about 100 angstroms for the materials described in the preferred embodiments. As quantum well thickness increases $\epsilon_h$ becomes increasingly greater than $\epsilon_e$ and self-doping will occur as described hereinbefore. When quantum wells 12 and 14 are sufficiently thin, $\epsilon_h$ is less than $\epsilon_e$ in an unbiased condition. Thus, when quantum wells 12 and 14 are thin, P-channel quantum well 12 and N-channel quantum well 14 are undoped and non-conductive absent an external bias.

Several features of the self-doping structure shown in FIG. 1 should be noted. First, the self-doping is simultaneous; both the N-channel and P-channel are activated with mobile charge to the same degree at the same time. Second, the nature of the materials used and the self-doping process results in a tremendous quantity of charge carriers being transferred between the wells so that once self-doping has occurred, charge carrier concentration is quite high in each of the quantum wells and conductivity is correspondingly high. Also, quantum wells 12 and 14 are free of impurities and thus achieve very close to their intrinsic mobility. Also, unlike conventionally doped quantum wells, when $\epsilon_h$ is less than $\epsilon_e$, charge carriers simply can not exist in either of the quantum wells because a forbidden energy gap exists between $\epsilon_h$ and $\epsilon_e$. This forbidden energy gap is expected to produce remarkably low leakage when the channels are in a non-conductive state.

Figure 4:
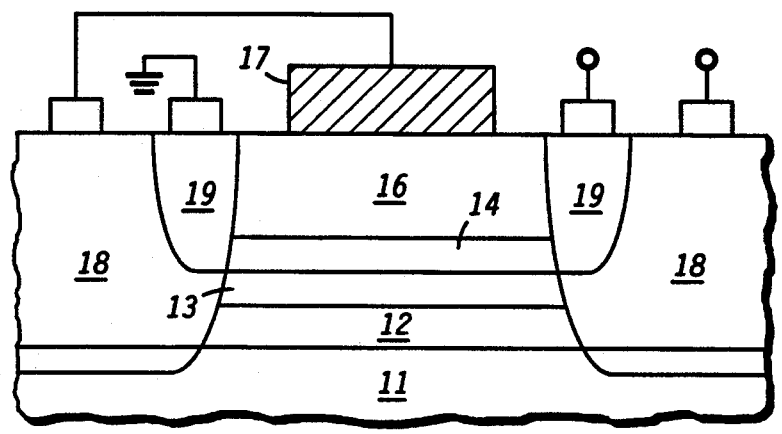
FIG. 4 illustrates a complementary field effect transistor SRAM cell in accordance with the present invention.

FIG. 4 illustrates a first embodiment logic device in accordance with the present invention. The structure shown in FIG. 4 is somewhat more complex than the structure shown in FIG. 1 as FIG. 4 illustrates actual structures needed to produce a self latched one bit static random access memory (SRAM) cell. Where the self doping feature is used to produce the structure of FIG. 4, the devices must be normally off as illustrated in FIG 2A and FIG. 2B. Layers and regions bearing the same designation as FIG. 1 comprise similar materials and perform similar functions as described in FIG. 1.

Starting with the epitaxial layer structure shown in FIG. 1, P-type source/drain regions 18 are formed on opposed sides of a single gate 17. P-type source/drain regions 18 extend from a surface of barrier 16 to P-channel quantum well 12. Similarly, N-type source/drain regions 19 are formed on opposed sides of gate 17 extending from the surface of barrier 16 to N-channel quantum well 14. Source/drain regions 18 and 19 are junction isolated from each other. In this embodiment, a positive voltage applied on gate 17 causes band bending as illustrated in FIG. 2B resulting in mutual self-doping of N-channel quantum well 14 and P-channel quantum well 12 simultaneously. Thus a single gate voltage makes both the N-channel and the P-channel devices conductive. This CHFET structure offers greatly reduced size from conventional CMOS designs and efficient use of the self-doping feature of the present invention.

One source/drain region 18a is coupled to gate 17, while the other source/drain region 18b is coupled to a first voltage supply. In this embodiment the first voltage supply is a positive supply, although polarity and magnitude can be varied to match other logic devices used in the circuit. One source/drain region 19a is coupled to a second voltage supply, illustrated as a ground potential. A conductive back plate (not shown) will usually be formed coupled to buffer layer 11. The conductive back plate should be coupled to the second voltage supply also to fix potential of buffer layer 11.

Another source/drain region 19b is used for coupling external readout circuitry to the SRAM cell, and would ordinarily be coupled to a data output bus via a gating circuit. In operation, a positive potential greater than threshold voltage applied to gate electrode 17 makes both N-channel 14 and P-channel 12 conductive and couples the first voltage supply to gate electrode 17, maintaining both devices in a first logic state (on). A sub-threshold voltage applied to gate 17 decouples the first power supply from gate electrode 17 and maintains both devices in a second (off) logic state. The logic state can be detected by external readout circuitry via the source/drain 19b. Additional circuitry required to control writing data into the single bit SRAM cell is not illustrated, but is well known in the semiconductor industry.

Because N-channel quantum well 14 and P-channel quantum well 12 are vertically stacked and are controlled by a single gate, they are coupled in a manner that eliminates need for a conventional cross-coupled circuit commonly used in CMOS designs. This reduces the number of devices required to realize a basic single bit SRAM cell from four to two. Further, because the two devices are vertically stacked, the surface area required to realize an SRAM cell is reduced to about the same area required for a single transistor in conventional CMOS designs. This space efficiency greatly enhances cost effectiveness of a SRAM circuit built in accordance with the present invention.

Figure 5:
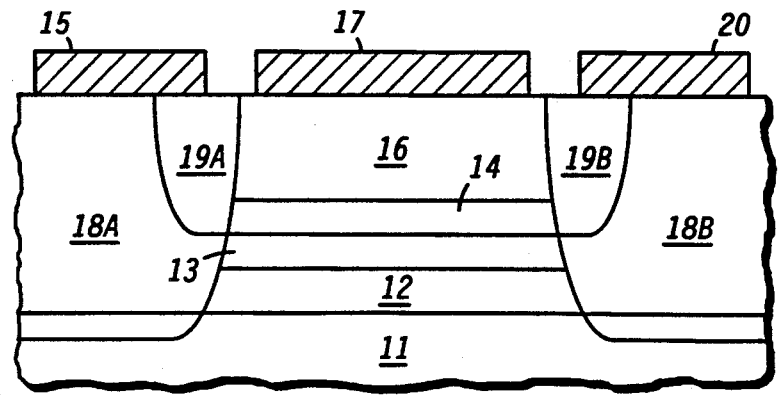
FIG. 5 illustrates a complementary field effect transistor transmission gate in accordance with the present invention.

FIG. 5 illustrates a transmission gate built in accordance with the present invention. It should be noted that the structure of the device is identical to that shown in FIG. 4, and differs from FIG. 4 only in the interconnection of source/drain regions 18 and 19 with gate 17. In this embodiment, input electrode 15 shorts source/drain 18a to source/drain 19a. Likewise, output electrode 20 shorts source/drain 18b to source/drain 19b.

In operation, a positive potential greater than threshold voltage applied to gate electrode 17 makes both N-channel 14 and P-channel 12 conductive and couples input electrode 15 to output electrode 20. Because input 15 and output 20 are coupled by both N-channel 14 and P-channel 12, the transmission gate is bidirectional and is expected to have very low resistance and very low noise.

Figure 6:
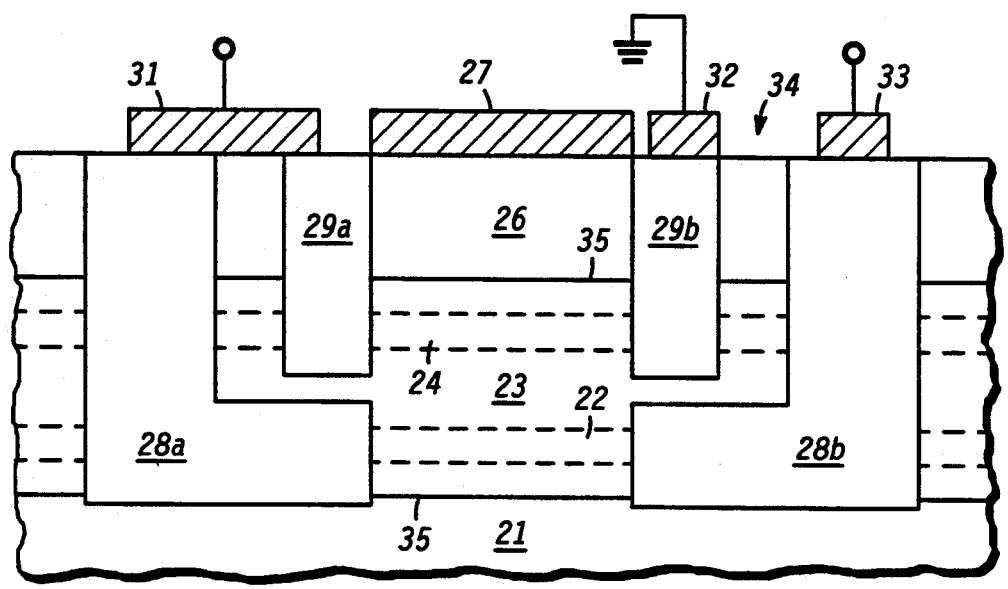
FIG. 6 illustrates a second embodiment complementary field effect transistor inverter gate in accordance with the present invention.

FIG. 6 illustrates yet another embodiment in accordance with the present invention which does not use the self-doping feature of the present invention. This embodiment uses vertically stacked complementary devices having convention modulation doping to provide an inverter gate. Because conventional doping is used, wider latitude is available as to selection of materials. For example, buffer layer 21 may comprise semi-insulating gallium arsenide (GaAs), P-channel quantum well 22 and N-channel quantum well 24 may comprise undoped indium gallium arsenide (InGaAs), first barrier 23 may comprise undoped GaAs and second barrier 26 may comprise undoped aluminum gallium arsenide (AlGaAs). The preferred material types are only exemplary, and those of skill in the semiconductor art will know of many substitute materials which result in acceptable bandgap relationships between layers.

Delta doping layers 35 are provided in buffer layer 11 and second barrier 26, and may be provided in first barrier 23 if desired. Delta doping layers 35 provide excess electrons to N-channel quantum well 14 and excess holes in P-channel quantum well 12. Source/drain region 28b may be isolated from source/drain region 29b by oxygen implantation between the regions as shown generally at 34, a well known isolation technique used in compound semiconductors. Oxygen implantation is used to isolate other regions where desired.

In operation, a positive voltage on gate 27 enhances N-channel quantum well 24 turning the N-channel HFET on and turns the P-channel HFET off. A negative voltage on gate 27 enhances P-channel quantum well 22 turning the P-channel HFET on and turning the N-channel HFET off. Zero bias on gate 27 turns off both devices. It should be understood that threshold voltage of the devices as well as enhancement/depletion mode operation can be chosen by the designer to meet specific circuit need. Because self-doping is not used, both positive and negative voltages are required. In the event that only N-channel or only P-channel devices are required, a single polarity will suffice.

As shown in FIG. 6, a useful application is provided when an output electrode 31 is coupled to short N-type source/drain region 29a to P-type source/drain region 28a. N-type source/drain region 29b is coupled to a first voltage source, while the P-type source/drain region 28b is coupled to second voltage source. The second voltage source is more positive than the first voltage source. A positive signal applied to gate 27 will activate N-channel 24 and couple the first power supply to output electrode 31 via source/drain region 29a. A negative signal coupled to gate 27 will activate P-channel 22 and couple the second power supply voltage to output electrode 31 via source/drain region 28.

In this manner, the structure of FIG. 6 provides a highly compact inverter cell, which can be used as a building block for many logic functions. Multiple input logic gates may also be provided with minor variations to the structure shown in FIG. 6. Also, many N-channel and P-channel devices can be vertically stacked to provide additional utility and compactness. Vertical stacking greatly improves efficiency of the device layout and improves performance by reducing parasitic capacitance associated with interconnections between devices. The embodiment shown in FIG. 6 makes clear that many of the advantages of vertically stacked HFET structure of the present invention can be achieved using conventional materials and conventional doping techniques available in industry.

By now it should be appreciated that logic circuits using vertically stacked field effect transistors with improved performance are provided. The HFET structure in accordance with the present invention allows optimal use of superior materials for HFET technology as well as efficient geometries for high packing density. Further, the logic circuits accordance with the present invention are basic building blocks which can be interconnected to provide any digital logic function using fewer devices and simpler circuitry than has been possible.

We claim:

1. A logic circuit comprising: a complementary heterojunction field effect transistor structure having an N-channel and a P-channel wherein conductivity of the N-channel and P-channel are controlled by a single control gate and the N-channel and P-channel are positioned parallel to each other and vertically spaced from each other by a predetermined separation thickness; a back gate electrode coupled to the P-channel and to a first voltage; a first drain electrode coupled to the P-channel and to a second voltage, wherein the second voltage is more positive than the first voltage; a first source electrode coupled to the P-channel and to the control gate, wherein the first source electrode is laterally spaced from the first drain electrode; a second drain electrode coupled to the N-channel which serves as a data output; and a second source electrode coupled to the N-channel and to the first voltage potential, wherein the second source electrode is laterally spaced from the second drain electrode.

2. The SRAM cell of claim 1 wherein the P-channel comprises a first quantum well, the N-channel comprises a second quantum well, wherein the predetermined thickness is chosen so that a bias voltage applied to the control gate electrode controls charge carrier transfer between first quantum well and the second quantum well and the second voltage coupled to the control gate causes electrons in the first quantum well to transfer to the second quantum well, creating a number of free electrons in the second quantum well and an equal number of free holes in the first quantum well.

3. The SRAM cell of claim 2 wherein the first quantum well comprises GaSb and the second quantum well comprises InAs.

4. The SRAM cell of claim 1 wherein a positive voltage greater than a threshold voltage on the control gate couples the second voltage to the control gate latching both the N-channel and the P-channel in a conductive state and a voltage less than the threshold voltage placed on the control gate latches both the N-channel and the P-channel in a non-conductive state.

5. A transmission gate comprising: a complementary heterojunction field effect transistor structure having an N-channel and a P-channel wherein the N-channel and P-channel are positioned parallel to each other and vertically spaced from each other by a predetermined separation thickness and conductivity of the N-channel and P-channel are controlled by a single control gate; a back gate electrode coupled to the P-channel and to a first voltage; a input electrode coupled to the P-channel and to the N-channel; and an output electrode coupled to the P-channel and to the N-channel so that current flow between the input and output electrodes is parallel to the N-channel and the P-channel and is controlled by the single control gate.

6. A logic circuit comprising: at least two vertically stacked field effect transistors wherein each of the field effect transistors has a single gate electrode, a source region formed on one side of the gate electrode, and a drain region formed on an opposite side of the gate electrode wherein the source and drain regions of each of the at least two field effect transistors are electrically isolated from source and drain regions of other of the at least two field effect transistors and conductivity of each of the field effect transistors is controlled by the single gate electrode.

7. The logic circuit of claim 6 wherein at least one of the field effect transistors comprises an N-channel and at least one of the field effect transistors comprises a P-channel.

8. The logic circuit of claim 7 wherein the N-channel and P-channel are mutually self doping.

9. The logic circuit of claim 7 wherein both the N-channel and the P-channel become conductive simultaneously when a bias voltage is applied to the gate electrode.

10. The logic circuit of claim 8 wherein one source region is coupled to the P-channel and to the gate electrode; one drain region is coupled to the P-channel and to a first voltage source; one source region is coupled to the N-channel and to a second voltage source, wherein the first voltage source is more positive than the second voltage source; and one drain region is coupled to the N-channel and is for coupling to an external readout circuitry to form a static random access memory cell.

11. The logic circuit of claim 8 wherein one source region is coupled to the N-channel and to an input electrode; one source region is coupled to the P-channel and to the input electrode; one drain region is coupled to the N-channel and to an output electrode; and one drain electrode is coupled to the P-channel and to the output electrode to form a transmission gate.

12. The logic circuit of claim 7 wherein the N-channel and the P-channel are modulation doped.

13. The logic circuit of claim 8 further comprising: a drain electrode coupled to the P-channel and to a first voltage source; a drain electrode coupled to the N-channel and to a second voltage source, wherein the first voltage source is more positive than the second voltage source; a source electrode is coupled to the P-channel and to an output electrode; and a drain electrode coupled to the N-channel and to the output electrode, wherein a first voltage coupled to the gate electrode makes the N-channel conductive, and a second voltage coupled to the gate electrode makes the P-channel conductive.

14. A static random access memory cell comprising: a first barrier layer having a first surface; a p-channel quantum well formed on the first barrier layer, wherein the p-channel quantum well has a characteristic hole wave function; a second barrier layer having a predetermined thickness comprising wide bandgap material formed on the p-channel layer; an n-channel quantum well formed on the second barrier layer, wherein the n-channel quantum well has a characteristic electron wave function and the predetermined thickness of the barrier layer is chosen to allow the electron wave function to overlap the hole wave function; a third barrier layer formed on the n-channel quantum well having a second surface; a first gate electrode formed on a portion of the first surface; a second gate electrode formed on a portion of the second surface, wherein the second gate electrode is in alignment with the first gate electrode; a pair of p-type source/drain regions formed in the first surface on opposed sides of the first gate electrode and extending to the p-channel quantum well; a pair of n-type source/drain region formed in the second surface on opposed sides of the second gate electrode and extending to the n-channel quantum well; wherein the valence band of the p-channel quantum well has a higher energy than the conduction band of the n-channel quantum well; a first power supply coupled to one p-type source/drain electrode; a second power supply coupled to both the first gate electrode and one of the n-type source/drain electrodes, wherein the first power supply has a positive potential with respect to the second power supply; whereby a positive potential on the second gate electrode simultaneously makes the p-channel quantum well and the n-channel quantum well conductive; an electrode coupling the other p-channel source/drain to the second gate electrode whereby both the n-channel and p-channel quantum wells can be programmably made conductive or non-conductive, and will remain in the programmed state with no power dissipation until the first gate electrode is forced to change state by external circuitry.

15. A SRAM cell comprising: a double channel field effect transistor having an N-channel and a P-channel controlled by a single gate electrode and the N-channel and P-channel are positioned parallel to each other and vertically spaced from each other by a predetermined separation thickness such that a positive voltage greater than a predetermined threshold voltage on the gate electrode activates both the N-channel and the P-channel; a P-type source region formed on a first side of the gate electrode and coupled to the P-channel and to the gate electrode; a P-type drain region formed on a second side of the gate electrode and coupled to the P-type channel and to a first power supply; a N-type source region formed on the first side of the gate electrode and coupled to the N-channel and to a second power supply; an N-type drain region formed on the second side of the gate electrode and coupled to the n-channel, wherein the N-type drain region serves as a data output terminal for the SRAM cell, whereby a positive voltage on the gate electrode couples the first power supply to the gate electrode and latches the SRAM cell in a first stable state, and a sub-threshold voltage on the gate electrode decouples the gate electrode from the first power supply thereby latching the SRAM cell in a second stable state.

* * * * *